United States Patent [19]

Iadanza

[11] Patent Number: 5,646,544

[45] Date of Patent: Jul. 8, 1997

[54] SYSTEM AND METHOD FOR DYNAMICALLY RECONFIGURING A PROGRAMMABLE GATE ARRAY

[75] Inventor: Joseph Andrew Iadanza, Hinesburg, Vt.

[73] Assignee: International Business Machines Corporation, Armonk, N.Y.

[21] Appl. No.: 462,392

[22] Filed: Jun. 5, 1995

[51] Int. Cl.[6] ............................................. H03K 19/173
[52] U.S. Cl. .................................... 326/38; 326/40
[58] Field of Search ................................ 326/40, 41

[56] References Cited

U.S. PATENT DOCUMENTS

| Re. 34,363 | 8/1993 | Freeman | 326/40 |
|---|---|---|---|
| 4,700,187 | 10/1987 | Furtek | 340/825.83 |
| 4,845,633 | 7/1989 | Furtek | 364/490 |
| 4,870,302 | 9/1989 | Freeman | 307/465 |
| 4,918,440 | 4/1990 | Furtek | 340/825.83 |
| 5,019,736 | 5/1991 | Furtek | 307/465 |
| 5,089,973 | 2/1992 | Furtek | 364/489 |
| 5,144,166 | 9/1992 | Camarota et al. | 307/465.1 |
| 5,155,389 | 10/1992 | Furtek | 307/465 |
| 5,208,491 | 5/1993 | Ebeling et al. | 307/465 |
| 5,239,510 | 8/1993 | Hill | 365/226 |
| 5,313,119 | 5/1994 | Cooke et al. | 307/465.1 |
| 5,336,950 | 8/1994 | Popli et al. | 307/465 |
| 5,347,519 | 9/1994 | Cooke et al. | 371/22.2 |
| 5,361,373 | 11/1994 | Gilson | 395/800 |
| 5,365,125 | 11/1994 | Goetting et al. | 326/39 |
| 5,426,378 | 6/1995 | Ong | 326/39 |
| 5,442,246 | 8/1995 | Azegami et al. | 326/41 |
| 5,465,056 | 11/1995 | Hsieh et al. | 326/41 |

*Primary Examiner*—Edward P. Westin
*Assistant Examiner*—Richard Roseen
*Attorney, Agent, or Firm*—Heslin & Rothenberg, P.C.; Susan M. Murray, Esq.

[57] ABSTRACT

In each of multiple logic cells of a Programmable Gate Array ("PGA"), a programing array is provided having multiple programming words therein. Each of the programming words is engagable to control the configuration of the logic cell. The programming words are selectively engaged such that multiple functions are performed by the logic cell within the PGA. As a result, a PGA with a number of virtual logic cells in excess of actual physical logic cells is provided. The PGA therefore has the capability to emulate a PGA with a larger number of logic cells than it physically has.

17 Claims, 7 Drawing Sheets

SYSTEM AND METHOD FOR DYNAMICALLY RECONFIGURING A PROGRAMMABLE GATE ARRAY

RELATED APPLICATION INFORMATION

This application relates to commonly owned concurrently or previously filed U.S. patent applications:

1. Ser. No. 08/459,579, entitled "PROGRAMMABLE ARRAY INTERCONNECT NETWORK."
2. Ser. No. 08/460,420, entitled "PROGRAMMABLE ARRAY I/O—ROUTING RESOURCE."
3. Ser. No. 08/460,481, entitled "PROGRAMMABLE LOGIC CELL."
4. Ser. No. 08/459,156, entitled "PROGRAMMABLE ARRAY CLOCK/RESET RESOURCE."

The section entitled "Description of the Preferred Embodiment(s)," and the drawings, from each of the above-referenced related U.S. patent applications are hereby expressly incorporated herein by reference.

TECHNICAL FIELD

This invention relates in general to programmable integrated circuit devices. More particularly, the present invention relates to a programmable array having dynamic reconfiguration capability.

BACKGROUND OF THE INVENTION

Programmable integrated circuits are known in the art and include programmable logic devices ("PLDs"), Programmable Array Logic ("PALs"), and Programmable Logic Arrays ("PLAs"). Each of these programmable circuits provides an input AND logic plane followed by an OR logic plane. An output function comprising the sum of the products of the input terms can thus be calculated. The logic planes are usually programmable such that the initial general layout of the planes may be customized for a particular application.

A more general approach to programmable circuits involves providing an array of distinct, uncommitted logic cells in a Programmable Gate Array ("PGA"). A programmable interconnect network is usually provided to interconnect the cells, and to provide data input to, and output from, the array. Customization or programming of the otherwise generally-designed logic cells and interconnect network is performed for a particular application. One such array is a Mask Programmable Gate Array ("MPGA"), in which the configuration of the cells and the wiring network occurs when adding the final layers of metallization to an integrated circuit. A modified approach involves the use of laser-directed energy to customize the metallization pattern. Another such array is a Field Programmable Gate Array ("FPGA") in which the configuration can be performed by a user, in the "field." Such configuration may be effected by using electrically programmable fusible links, antifuses, memory-controlled transistors, or floating-gate transistors. All of the above referenced types of programmable logic integrated circuits are referred to herein as "programmable arrays."

In an implementation of an FPGA using Static Random Access Memory ("SRAM") cells to hold configuration information, at system power-up/initialization the FPGA reads in the configuration information to the SRAM cells from an external source. More specifically, (FIG. 1) a state machine 17 within an FPGA 13 reads a parallel or sequential programming bit stream from a Read Only Memory ("ROM") 11 external to FPGA 13. The programming bit stream is read into the FPGA over data path 23 and is appropriately directed to individual programming cells of each logic cell 19 within the FPGA over data path 21. Conventional control communications are implemented between RAM 11 and state machine 17 to facilitate the data transfer. As is well known, FPGAs contain an array 15 of logic cells 19 interconnected by horizontal and vertical interconnects 25. These horizontal and vertical interconnects 25 comprise inter-cell programmable routing resources which facilitate communications between logic cells.

Connected within each logic cell 19 of the FPGA is a programming word 31 (FIG. 2). This programming word includes the above-described programming cells as bits (33a–33h) therein. Although, as an example, an 8 bit programming word is shown, programming words may comprise 1×N (N>1) bit register structures, wherein N is sized as needed to adequately control the logic cell. Once a programming word 31 is loaded, coupling between the individual bits thereof, the programmable logic 27 and the programmable routing resources 29 facilitates control of the configuration of logic cell 19. Programmable logic 27 and programmable routing resources 29 are interconnected by data paths 35. In some implementations, the programmable routing resources may be located external to logic cells 19.

Conventional logic cell 19 can only be used for a single programmed function at a time. Reconfiguration of the logic cell requires reactivation of the state machine and rewriting of the programming words. Such reprogramming during functional operation of the FPGA is possible, but requires relatively large delays and at least partial disruption of operations of the particular logic cell being reloaded.

Although FPGAs are more flexible than their prior mask programmed counterparts, even moderately complex logic functions can only be implemented using large silicon areas. This results from the data-flow oriented nature of FPGAs. Specifically, data is passed from programmed logic cell to programmed logic cell with a preprogrammed logic function applied at each logic cell. Because each logic cell has a large overhead for providing a single programmed function, not to mention the large overhead associated with the programmable routing resources, overall FPGA logic densities remain low. Furthermore, these conventional datapath-oriented implementations suffer penalties in the areas of timing and performance due to inconsistencies in signal routing for different bits in the datapath.

The present invention is directed toward solving the above-noted problems.

SUMMARY OF THE INVENTION

In a first aspect, the present invention includes a configuration system for a logic cell within a programmable array ("PA"). The configuration system comprises a plurality of programming words simultaneously stored in the PA, of which each programming word is engagable to control a configuration of the logic cell. Further included is a means to engage a selected programming word of the plurality of programming words to control the configuration of the logic cell.

As enhancements, the plurality of programming words may comprise a programming array within which each programming word may have, for example, N bits (N>1). Further, the programming array may comprise a static random access memory ("SRAM") array having M×N bits.

As a further enhancement, the means to engage may comprise a programmable counter for sequentially engaging different programming words of the programming array. The programmable counter may even comprise at least one other logic cell of the PA.

In another aspect, the present invention comprises a method for configuring a logic cell within a programmable array. The logic cell is controllable by each programming word of a plurality of programming words associated with the logic cell and simultaneously stored in the PA. The method includes determining a selected programming word of the plurality of programming words and engaging it to control the configuration of the logic cell.

As an enhancement, the method may include engaging a different selected programming word, or engaging a sequence of selected programming words. The plurality of programming words may be preprogrammed, and further, reprogrammed. Individual programming words may be reprogrammed without reprogramming other programming words.

In yet another aspect, the logic cell of the present invention may be within an IC chip. The IC chip may comprise many different types of IC chips within which the logic cell would be useful including, for example, a Field Programmable Gate Array, a microprocessor, or an Application Specific Integrated Circuit.

To summarize, the present invention has many advantages and features associated with it. The FPGA architecture disclosed resolves problems in both density and timing that are associated with data-flow based FPGA architectures. By providing alternate configurations of an array of logic cells, many more virtual logic cells are provided. This greatly enhances the functionality and capabilities of even a moderately sized array of logic cells. The reduction in actual physical logic cells needed to implement a function means that data spends more time resident in a single cell, and less time in transit between cells in the unpredictable timing environment of the inter-cell routing. The control-flow architecture of the present invention therefore yields significant timing improvements. Thus, the features of the present invention expand and enhance the capabilities of field programmable gate arrays.

BRIEF DESCRIPTION OF THE DRAWINGS

The subject matter regarded as the invention is particularly pointed out and distinctly claimed in the concluding portion of the specification. The invention, however, both as to organization and method of practice, together with further objects and advantages thereof, may best be understood by reference to the following detailed description of a preferred embodiment and the accompanying drawings in which:

DESCRIPTION OF THE PREFERRED EMBODIMENT(S)

According to the present invention, a logic cell is coupled to an array of programming words referred to herein as a programming array. The output of the programming array comprises a selected programming word that serves as a configuration input to the programmable logic and programmable routing resources in the logic cell thereby facilitating configuration thereof.

Figure 1:
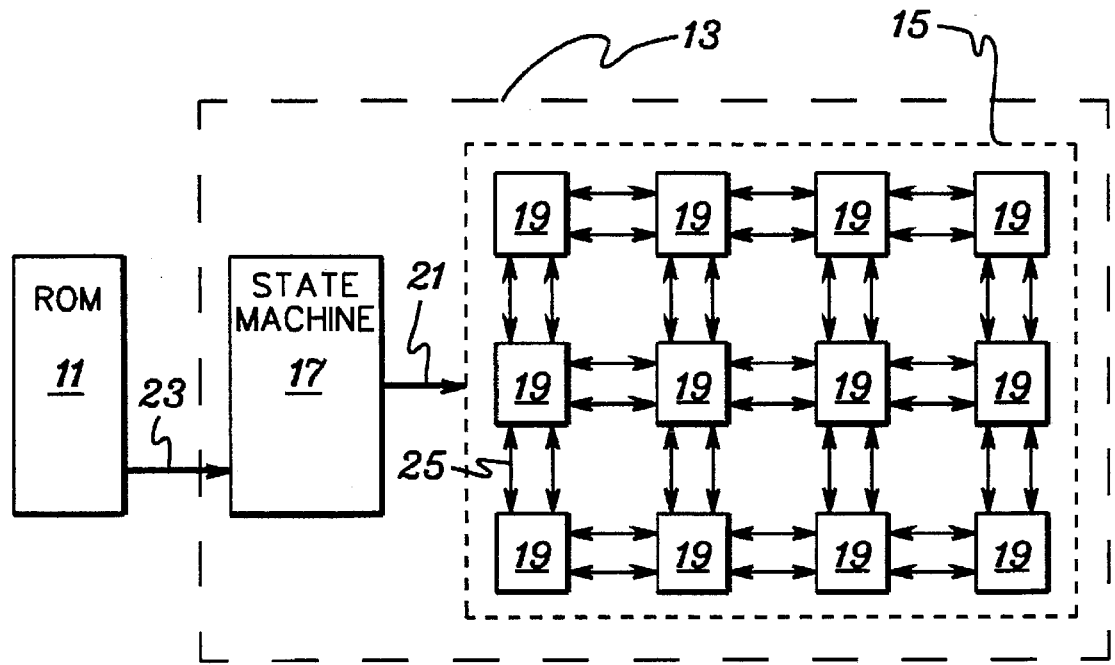
FIG. 1 is a diagram of a conventional FPGA connected to an external ROM containing configuration data.
Figure 2:
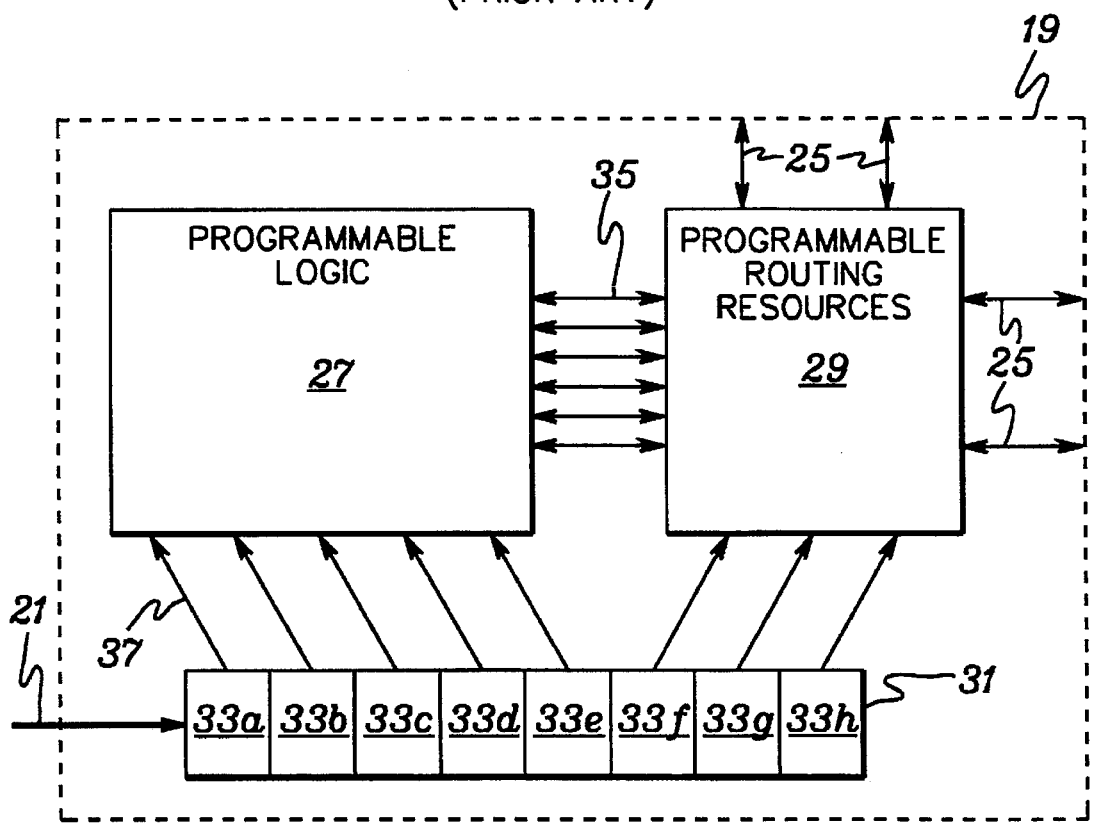
FIG. 2 is a diagram of a logic cell of the conventional FPGA of FIG. 1.
Figure 3:
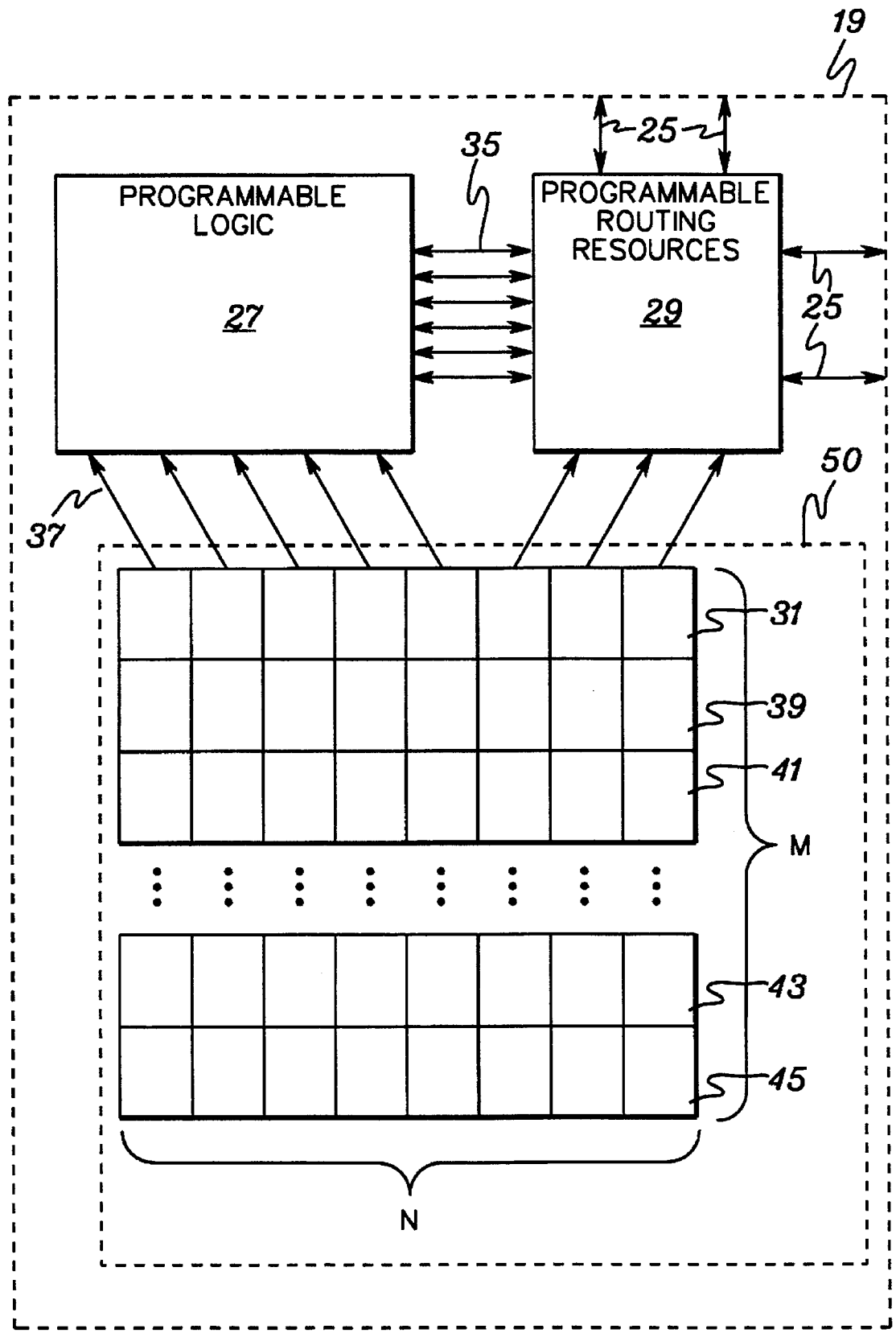
FIG. 3 is a diagram of a logic cell of an FPGA having a programming array pursuant to one embodiment of the present invention.

As shown in FIG. 3, a logic cell 19 includes a programming array 50 including, for example, programming words 31, 39, 41, . . . 43 and 45. In total, programming array 50 comprises an array of M programming words of N bits each, forming an M×N programming array. A selected programming word of the programming array is coupled to the programmable logic 27 and programmable routing resources 29 through data paths 37 such that the logic cell is appropriately configured. Such selective coupling can be performed by many techniques that will be apparent to one of ordinary skill in the art such as, for example, multiplexing and transfer gate coupling.

Figure 3A:
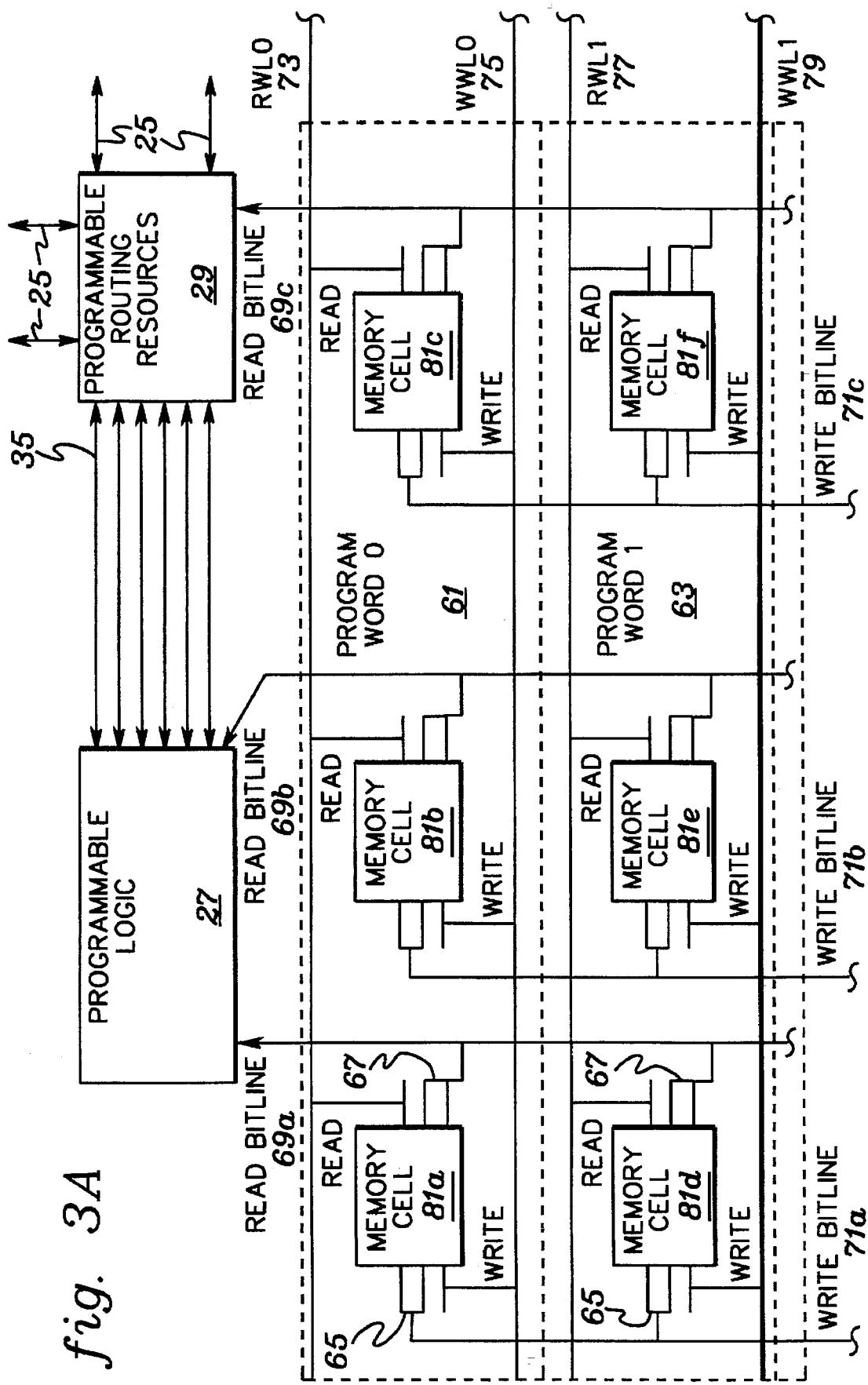
FIG. 3A is a diagram of individual memory cells within a logic cell according to one embodiment of the present invention.

As an example, further details regarding programming bits in the programming words of the programming array are shown in FIG. 3A. In this example, there are two programming words (programming words 0 (61) and programming word 1 (63)) and three memory cells (i.e., bits) per programming word. The individual memory cells (81a–f) may comprise, for example, conventional dual ported memory cells employing transfer gates (write transfer gates 65 and read transfer gates 67) at each of their data input and output.

The outputs of each "column" of memory cells are connected together as read bitlines 69a–c and are routed to either the programmable logic 27 or programmable routing resources 29 depending on the particular FPGA design. When a Read Word Line ("RWL"—73 or 77) is engaged, the corresponding programming word (i.e., row of memory cells) asserts its output as the selected configuration of the logic cell. For example, if RWL0 73 is engaged, programming word 0 (61) will determine the configuration of the logic cell. The read word lines may be coupled to, for example, a programmable counter or the interconnect network as discussed further hereinbelow.

The inputs of each "column" of memory cells are connected together as write bitlines 71a–c and are routed to a state machine to facilitate programming by the data retrieved from a ROM. When one of the Write Word Lines ("WWL"—75 or 79) is engaged, the data presented on the write bitlines is written into the memory cells of the programming word corresponding to the selected WWL. For example, if WWL0 75 is engaged, programming word 0 (61) will be written with the data presented on the write bitlines 71a–c. During programming, the state machine writes each programming word in such a manner. Conventional programming is performed in a similar manner, although only a single programming word is present for each logic cell. The write wordlines may be coupled to the state machine by conventional multiplexing to facilitate programming of selected programming words.

The ability to dynamically engage a selected programming word from a programming array allows near instantaneous reconfiguration of logic cell 19. This obviates, for example, previously required download times for reloading SRAM based programming words. Although the present invention is described herein with regard to an SRAM based programming array, it is also applicable to other storage techniques known to be used in connection with FPGAs. If, for example, fuse/antifuse architectures are used, reprogrammability of the array is lost, but density improvements are achieved.

Figure 4:
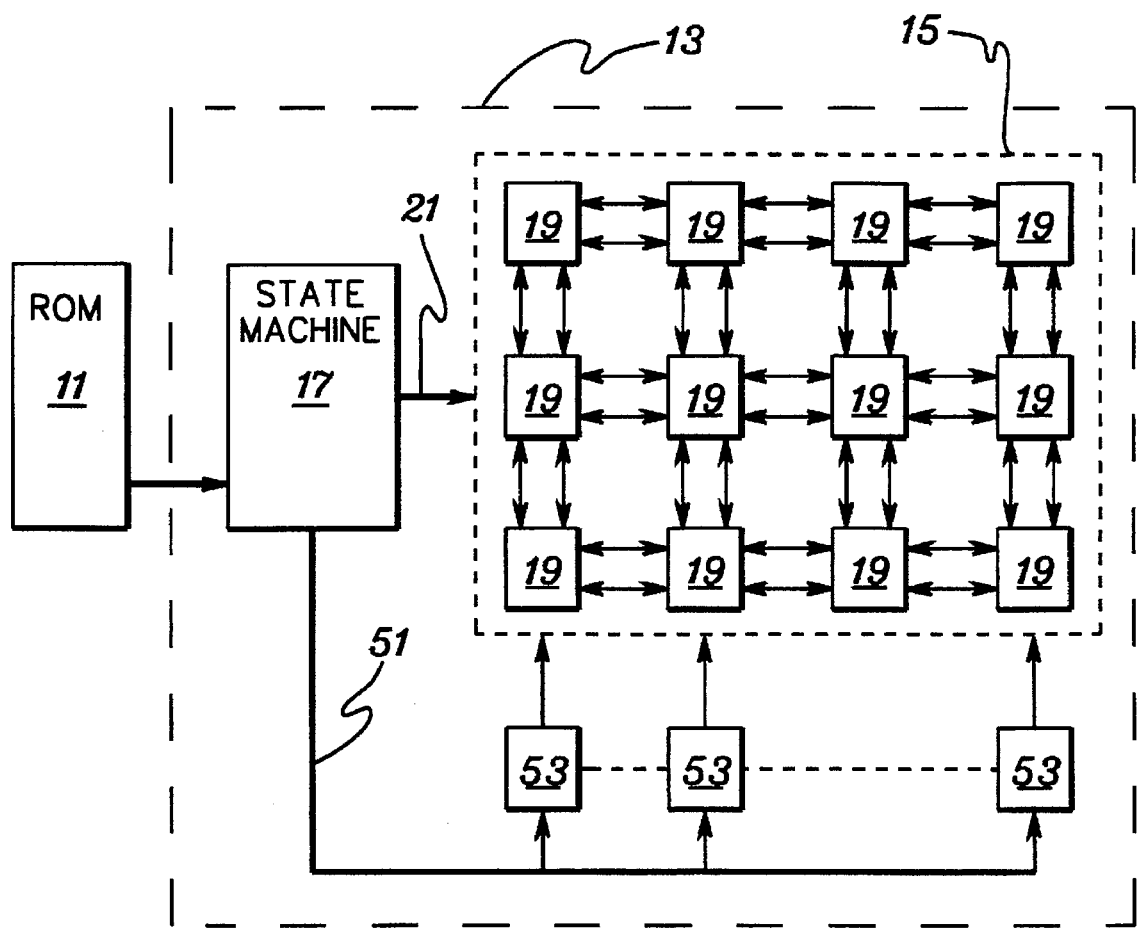
FIG. 4 is a diagram of an FPGA that includes the logic cell of FIG. 3 in accordance with an embodiment of the present invention.

Shown in FIG. 4 is a diagram of FPGA 13 coupled to ROM 11. Each of the logic cells 19 includes the programming array of the present invention. At system power-up/initialization, the FPGA 13 reads configuration information into the programming arrays associated with the logic cells 19 as discussed above. More particularly, a state machine 17 within FPGA 13 reads a parallel or sequential programming bit stream from ROM 11 that is disposed external to FPGA 13. The programming bit stream is appropriately directed to the programming words of the programming array of each logic cell 19 within the FPGA over data path 21. The state machine is coupled to the wordline of each programming word through, for example, conventional multiplexing circuitry such that each programming word may be loaded.

The programming array maintains the ability to be reprogrammed in whole or in part, even during functional operation of the FPGA. Such reprogramming for the single programming word of conventional logic cells is available in some FPGAs and implementation thereof in connection with the present invention will be apparent to one of ordinary skill in the art. One example of such reconfiguration can be found in U.S. Pat. No. 5,336,950, entitled "CONFIGURATION FEATURES IN A CONFIGURABLE LOGIC ARRAY," issued Aug. 9, 1994 which is expressly incorporated herein by reference in its entirety.

In conventional FPGAs, reprogramming the single programming word for a logic cell was difficult because that programming word determined the operational function of the corresponding logic cell. In the present invention, non-selected programming words of the array may be reprogrammed without any interruption in operation of the FPGA. Such reprogramming is performed by presenting data to be written on the write bitlines and latching the data into the desired programming word by engaging its write wordline.

Figure 5:
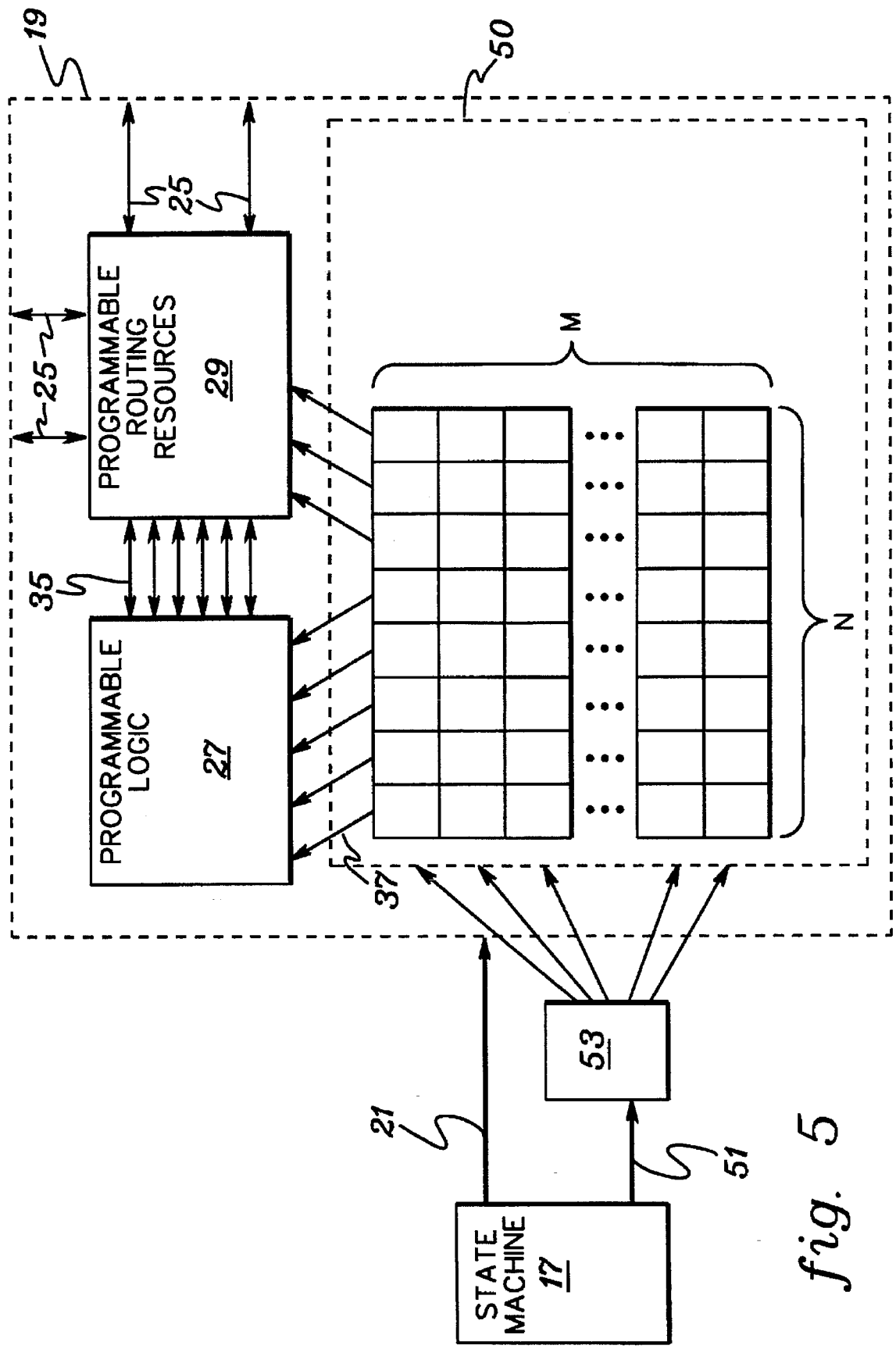
FIG. 5 is a diagram of the logic cell of FIG. 3 connected to a programmable counter for sequential engagement of programming words in conformance with one embodiment of the present invention.

With reference to FIG. 4, programmable counters 53 may be coupled to the programming arrays of the logic cells. As one implementation example (FIG. 5), A FPGA of the present invention can be implemented having a single, shared programmable counter 53 with its output coupled to the read wordlines of the logic cells. In operation, while programmable counter 53 is not changing, the FPGA functions conventionally, with the selected programming word for each logic cell determining the particular logic cell's configuration. However, as programmable counter 53 is clocked, the counter sequences in a preprogrammed manner through the address range of the programming array 50 of each logic cell, changing the logic cell's configuration.

For each cell, as the address outputs of the counter are updated with each clock cycle, programming array 50 updates to provide a selected programming word to logic cell 19, thereby updating the logic cell's configuration. Data from the previous clock cycle is held undisturbed in logic cell latches (not shown) and is then processed against the new logic cell function and latched before the end of the new clock cycle. After that, the cell function is again updated by the programmable counter. The individual techniques for such latching will be apparent to one of ordinary skill in the art and are used in many different applications including, for example, other FPGAs and pipelined processors.

This is only one example of how the programmable counters can be organized. There could be one programmable counter per column of logic cells (FIG. 4), one programmable counter for the entire FPGA or any other useful organization of programmable counters. Of course, having more programmable counters per logic cell will provide greater operational flexibility, but at the expense of silicon real estate.

The ability to dynamically change the programming of the logic cells in the FPGA as data passes therethrough facilitates the creation of many additional logic cell configurations. In this way, a few programmable logic cells can be used to emulate many fixed logic cells. A large virtual circuit density is thus created which more than accounts for the additional silicon real estate used by the programming arrays and programmable counters.

In further regard to the operation of the programmable counters, the programming capability thereof provides, for example, the ability to:

1. sequence through the entire address space of the programming array in a forward or a reverse direction;
2. loop on a subsection of the address space; and
3. jump to specific locations within the address space.

In essence, the programmable counter functions as a programmable state machine whose outputs control the address inputs to the programming arrays. Accordingly, with each change in state of the programmable counter, a corresponding programming word is coupled to the logic cell changing the configuration thereof. The counter itself may be implemented using dedicated logic, or even with programmed logic cells of the FPGA.

Advantageously, since the contents of the programming array are accessible from the state machine, portions of the array can be updated while not being accessed by the counter. Further, the programming of the counter could be changed as well, or, in the case where multiple counters exist, the address connections from the programming array could be routed to a differently programmed counter. Many more such configuration variations are possible. The individual techniques required for such routing and configuration control are well known in the FPGA art and include, for example, multiplexing, transfer gates and tri-state circuits driven by programming word bits.

Figure 6:
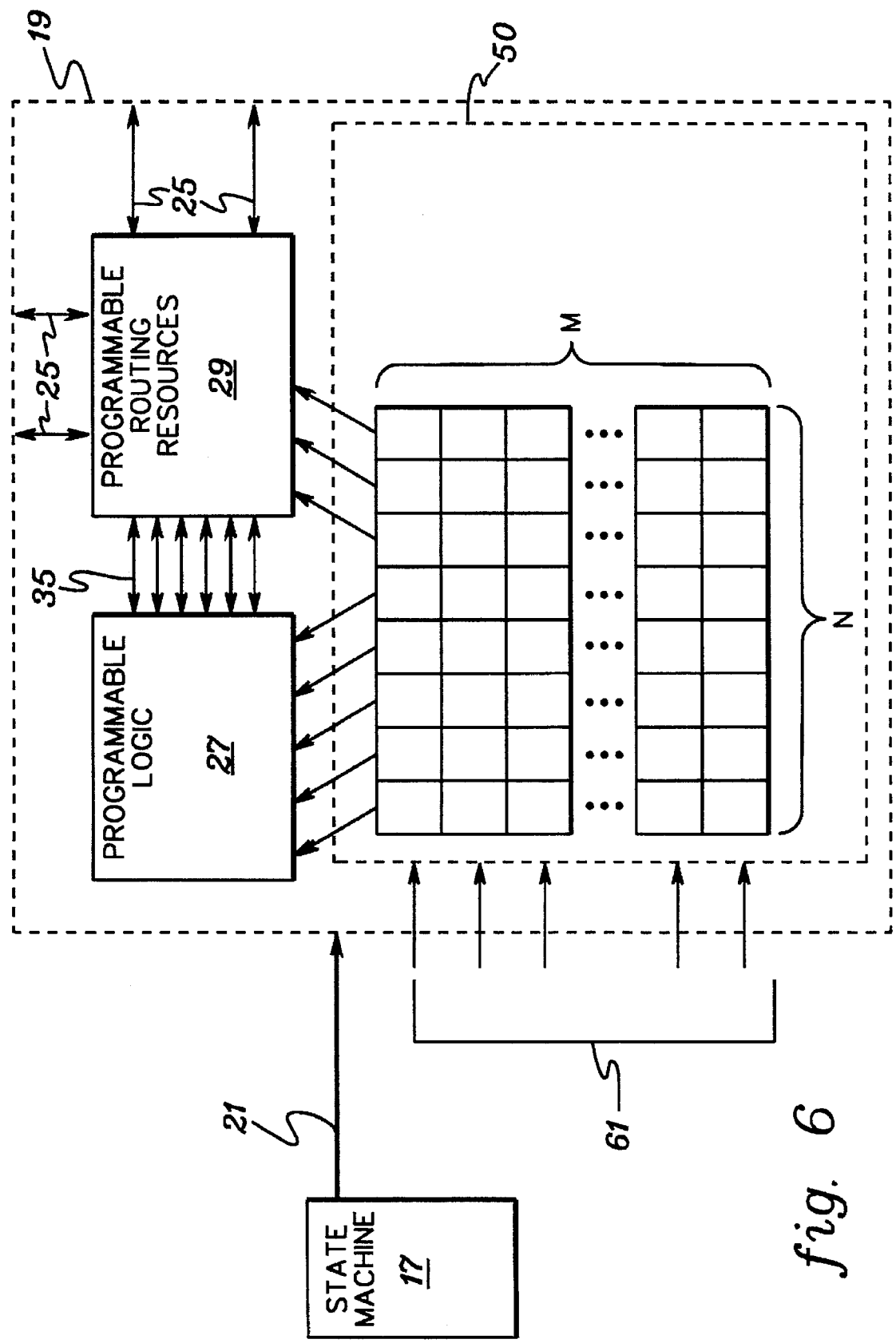
FIG. 6 is a diagram of the logic cell of FIG. 3 with a wordline for each programming word that facilitates engagement thereof by signals from the FPGA routing matrix pursuant to an embodiment of the present invention.

In an alternate embodiment of the present invention (FIG. 6), each of the M programming words of the programming array 50 has a wordline 61. When a signal is asserted on the wordline of an individual programming word, that word is used to control the configuration of the logic cell 19. These wordlines are programmably connected to the interconnect matrix within the FPGA such that connections thereto can be effected by logic cells therein (and external sources). This facilitates, for example, creating the programmable counter from logic cells of the FPGA as discussed hereinabove.

By way of general discussion, various technologies are known to those skilled in the art to provide array programmability. Any of these techniques, or variants thereof, can be used to program the programming array of the present invention. Mask programming techniques include customizing the deposition of the final layers of metallization of an otherwise generally designed integrated circuit (see, for example, U.S. Pat. No. 3,993,919 to Cox et al. entitled "PROGRAMMABLE LATCH AND OTHER CIRCUITS FOR LOGIC ARRAYS," Nov. 23, 1976; and U.S. Pat. No. 4,742,383 to Fitzgerald entitled "MULTI-FUNCTION FET MASTERSLICE CELL," May 3, 1988; both patents assigned to the same assignee as the present application). Laser programming techniques involve customizing the metallization layers following their deposition (see, for example, Raffel et al., "A WAFER-SCALE DIGITAL INTEGRATOR USING RESTRUCTURABLE VLSI," IEEE Journal of Solid-State Circuits, Vol. SC-20, No. 1, February 1985, at pg. 399). Fusible links or antifuses can be employed and offer permanent (non-volatile) programming (see, for example, Millman, "MICROELECTRONICS," McGraw-Hill, Inc., 1979, at pg. 196; and U.S. Pat. No. 4,758,745 to Elgamal et al. entitled "USER PROGRAMMABLE INTEGRATED CIRCUIT INTERCONNECT ARCHITECTURE AND TEST METHOD," Jul. 19, 1988). Erasable programmable read only memory ("EPROM") and electrically erasable programmable read only memory ("EEPROM") devices can be used and offer semipermanent programming. EPROMS and EEPROMS are both electrically programmable and hold their states, even if power is removed. Special erase procedures can be used, however, to reconfigure the devices (see, for example, Wood et al., "AN ELECTRICALLY ALTERABLE PLA FOR FAST TURN-AROUND TIME VLSI DEVELOPMENT HARDWARE," IEEE Journal of Solid-State Circuits, Vol. SC-16, No. 5, October 1981, at pg. 570). Finally, volatile random access memory ("RAM") devices are also available which are fully programmable and reprogrammable, but which lose their programmed state if power is removed (see, for example, U.S. Pat. No. 4,177,452 to Balasubramanian et al., Dec. 4, 1979, assigned to the same assignee as the present application). These and other techniques for programming arrays are known to those in the art and are also generally described in the publication entitled "FIELD-PROGRAMMABLE GATE ARRAYS" by S. Brown, R. Francis, J. Rose and Z. Vranesic, Kluwer Academic Publishers, 1992. Each of the above-named sources is hereby incorporated herein by reference in its entirety.

A preferred approach for programming the logic cell and routing resources of the present invention involves SRAM memory cells, programmed by a user. The SRAM memory cells can be configured in accordance with the techniques disclosed in the publication entitled "APPLICATION NOTE AT6000 SERIES CONFIGURATION", May 1993, Revision 1B, Atmel Corporation, which is hereby incorporated by reference in its entirety.

Figure 7:
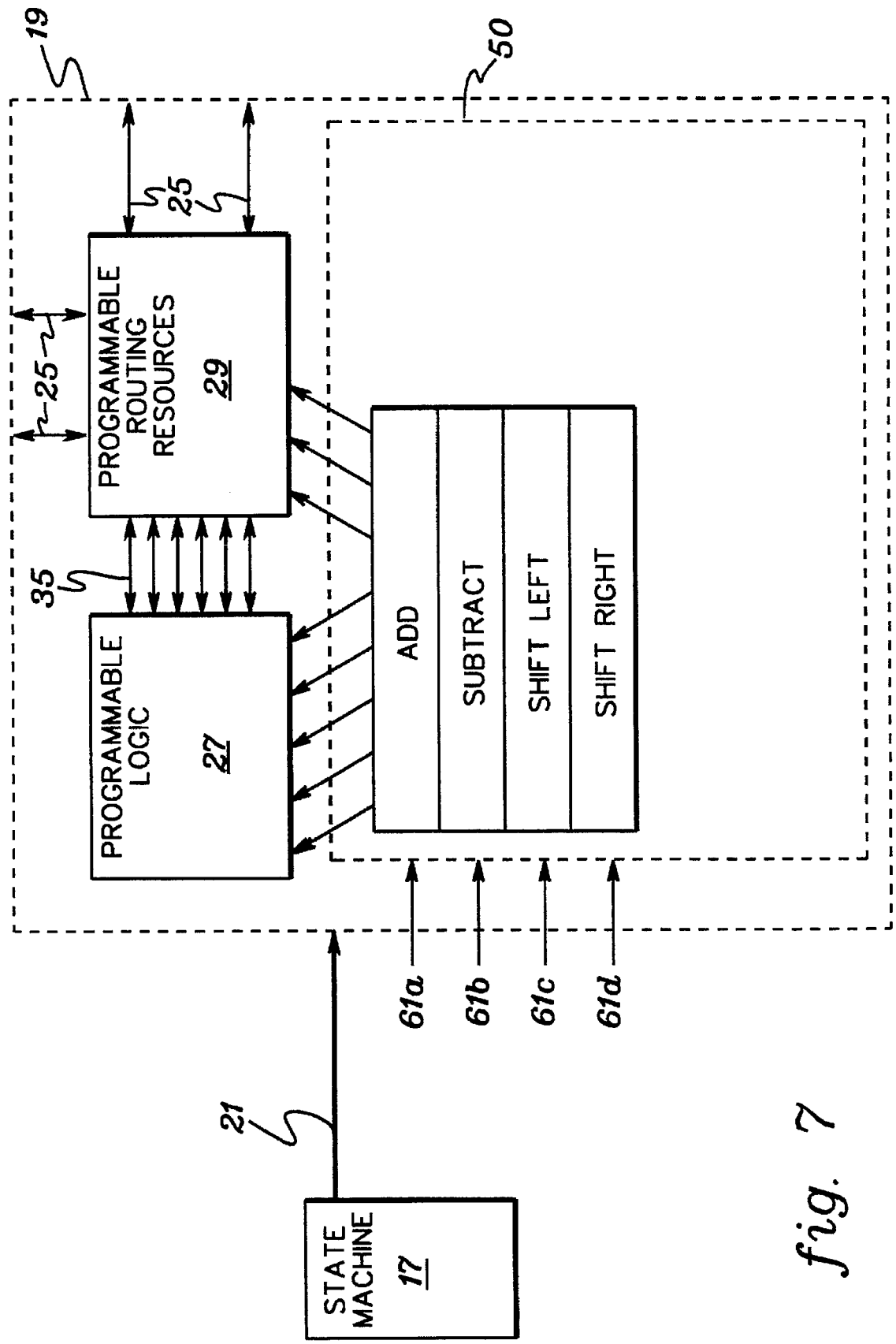
FIG. 7 is a diagram of a logic cell programmed to perform various math functions according to one embodiment of the present invention.

As one application example, a programmed logic cell 19 of an FPGA is shown in FIG. 7. The logic cell is programmed to perform one of four selectable math functions. Each of the four functions has been programmed into the logic cell by way of four selectable programming words. If wordline 61a is engaged, a programming word comprising the appropriate programming such that the cell performs an addition function is selected for logic cell 19. Similarly, engaging wordline 61b will effect a subtraction function in the cell while engaging wordlines 61c or 61d will effect a shift left or shift right function in the cell, respectively. In this example, the wordlines would be coupled to other logic cells in the FPGA that would select the appropriate wordline to engage the desired mathematical functions.

The techniques of the present invention can be used outside of stand alone FPGA applications. For example, the logic cell and its associated programming array are usable as a programmable core within other integrated circuits, such as, for example, an Application Specific Integrated Circuit ("ASIC") or a microprocessor. The programmable core would comprise a programmable array as disclosed herein. Such a use would facilitate flexibility concerning reconfiguration for, and performance of, new computational tasks.

The present invention has many advantages and features associated with it. The FPGA architecture disclosed resolves problems in both density and timing that are associated with data-flow based FPGA architectures. By providing alternate configurations of an array of logic cells, many virtual logic cells are provided. This greatly enhances the functionality and capabilities of even a moderately sized array of logic cells. The reduction in actual physical logic cells needed to implement a function means that data spends more time resident in a single cell, and less time in transit between cells in the unpredictable timing environment of the inter-cell routing. The control-flow architecture of the present invention therefore yields significant timing improvements. Thus, the techniques of the present invention expand and enhance the capabilities of field programmable gate arrays.

While the invention has been described in detail herein in accordance with certain preferred embodiments thereof, many modifications and changes therein may be effected by those skilled in the art. Accordingly, it is intended by the following claims to cover all such modifications and changes as fall within the true spirit and scope of the invention.

What is claimed is:

1. A configuration system for a logic cell within a programmable array, comprising:

a plurality of programming words simultaneously stored in said programmable array, of which each of at least two programming words is engagable to control a configuration of the logic cell; and means to engage a selected programming word of said at least two programming words to control the configuration of the logic cell, including a wordline for each of said at least two programming words to selectively engage the respective programming word;

wherein said means to engage further includes means for coupling the wordlines to selected logic cells within the programmable array to facilitate engagement of the selected programming word by said selected logic cells.

2. A configuration system for a logic cell within a programmable array, comprising:

a plurality of programming words simultaneously stored in said programmable array, of which each of at least two programming words is engagable to control a configuration of the logic cell; and means to engage a selected programming word of said at least two programming words to control the configuration of the logic cell;

wherein said means to engage comprises a programmable counter for sequentially engaging different programming words of said at least two programming words.

3. The configuration system of claim 2, wherein said programmable counter comprises at least one other logic cell of the programmable array.

4. The configuration system of claim 2, wherein said programmable counter comprises means for sequentially engaging each programming word of said at least two programming words as said selected programming word.

5. The configuration system of claim 2, wherein said programmable counter comprises means for repeatedly sequentially engaging the individual words of a preprogrammed subset of programming words of said at least two programming words as said selected programming word.

6. The configuration system of claim 2, wherein said programmable counter comprises a common programmable counter to said logic cell and to other logic cells within said programmable array.

7. The configuration system of claim 2, wherein said programmable counter is only utilized by said logic cell of all logic cells within said programmable array.

8. An integrated circuit chip having a logic cell therein, said logic cell comprising:

a plurality of programming words simultaneously stored in the logic cell, of which each of at least two programming words is engagable to control a configuration of the logic cell; and means to engage a selected programming word of said at least two programming words to control the configuration of the logic cell;

wherein said integrated circuit chip further comprises an Application Specific Integrated Circuit macro or a microprocessor macro.

9. A configuration system for a logic cell within a programmable array, comprising:

a plurality of programming words simultaneously stored in said programmable array, of which each of at least two programming words is engagable to control a configuration of the logic cell; and means to engage a selected programming word of said at least two programming words to control the configuration of the logic cell;

wherein said means to engage comprises at least one other logic cell within said programmable array.

10. A configuration system for a logic cell within a programmable array, comprising:

a plurality of programming words simultaneously stored in said programmable array, of which each of at least two programming words is engagable to control a configuration of the logic cell;

means to engage a selected programming word of said at least two programming words to control the configuration of the logic cell; and means for writing to a different programming word than said selected programming word, while said logic cell remains operational using said selected programming word.

11. The configuration system of claim 10, wherein said means for writing comprises a dual-ported memory including said at least two programming words.

12. A method for configuring a logic cell within a programmable array, said logic cell being controllable by each programming word of at least two of a plurality of programming words associated with said logic cell and simultaneously stored in said PA, said method comprising:

determining a selected programming word of said at least two programming words;

engaging said selected programming word to control the configuration of the logic cell; and writing to a different programming word than said selected programming word, while said logic cell remains operational using said selected programming word.

13. The method of claim 12, wherein said logic cell includes a dual-ported memory including said at least two programming words, and wherein said writing comprises writing a new programming word to said dual-ported memory while simultaneously reading said selected programming word therefrom.

14. A method for configuring a logic cell within a programmable array, said logic cell being controllable by each of at least two programming words of a plurality of programming words associated with said logic cell and simultaneously stored in said programmable array, said method comprising:

determining a sequence of selected programming words of said at least two programming words;

engaging said sequence of selected programming words to sequentially control the configuration of the logic cell; and sequentially engaging the programming words of said at least two programming words as said sequence of selected programming words.

15. A method for configuring a logic cell within a programmable array, said logic cell being controllable by each of at least two programming words of a plurality of programming words associated with said logic cell and simultaneously stored in said programmable array, said method comprising:

determining a sequence of selected programming words of said at least two programming words;

engaging said sequence of selected programming words to sequentially control the configuration of the logic cell; and repeatedly sequentially engaging the individual words of a preprogrammed subset of programming words of said at least two programming words as said sequence of selected programming words.

16. A logic cell comprising:

a plurality of programming words simultaneously stored within the logic cell, of which each of at least two programming words is engagable to control a configuration of the logic cell; and means to engage a selected programming word of said at least two programming words to control the configuration of the logic cell;

wherein said means to engage includes a programmable counter for engaging the individual words of a preprogrammed sequence of said at least two programming words as said selected programming word.

17. An integrated circuit chip having a logic cell therein, said logic cell comprising:

a plurality of programming words simultaneously stored in the logic cell, of which each of at least two programming words is engagable to control a configuration of the logic cell; and means to engage a selected programming word of said plurality of programming words to control the configuration of the logic cell;

wherein said means to engage includes a programmable counter for engaging the individual words of a preprogrammed sequence of said at least two programming words as said selected programming word.

\* \* \* \* \*